(12) United States Patent
Haroun et al.

(10) Patent No.: US 12,609,709 B2
(45) Date of Patent: *Apr. 21, 2026

(54) HIGH LINEARITY PHASE INTERPOLATOR

(71) Applicant: Texas Instruments Incorporated, Dallas, TX (US)

(72) Inventors: Baher Haroun, Allen, TX (US); Wenting Zhou, Milpitas, CA (US); Kai Yiu Tam, Santa Clara, CA (US); Reza Hoshyar, San Jose, CA (US); Ali Kiaei, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/080,879

(22) Filed: Oct. 27, 2020

(65) Prior Publication Data

US 2021/0044300 A1      Feb. 11, 2021

Related U.S. Application Data

(63) Continuation of application No. 15/346,524, filed on Nov. 8, 2016, now Pat. No. 10,855,294.

(51) Int. Cl.
*H03L 7/16* (2006.01)
*H03K 23/00* (2006.01)
(52) U.S. Cl.
CPC .............. *H03L 7/16* (2013.01); *H03K 23/00* (2013.01)
(58) Field of Classification Search
CPC ......... H03K 23/00–008; H03K 3/0231; H03K 4/502; H03K 4/023; H03K 4/50;
(Continued)

(56) References Cited

U.S. PATENT DOCUMENTS

| | | | |
|---|---|---|---|
| 6,009,534 A | 12/1999 | Chiu et al. | |
| 6,121,811 A | 9/2000 | Scott et al. | |

(Continued)

FOREIGN PATENT DOCUMENTS

| | | |
|---|---|---|
| JP | H09-153773 A | 6/1997 |
| WO | 02076009 A1 | 9/2002 |

OTHER PUBLICATIONS

"Fractional Frequency Clock Divider with Direct Division", U.S. Appl. No. 15/281,617, filed Sep. 30, 2016, pp. 1-17.

(Continued)

*Primary Examiner* — Patrick C Chen
(74) *Attorney, Agent, or Firm* — Zhenhai Fu; Frank D. Cimino

(57) ABSTRACT

A high linearity phase interpolator (PI) is disclosed. A phase value parameter indicative of a desired phase difference between an output signal and an input clock signal edge may be provided by control logic. A first capacitor may be charged for a first period of time with a first current that is proportional to the phase value parameter to produce a first voltage on the capacitor that is proportional to the phase value parameter. The first capacitor may be further charged for a second period of time with a second current that has a constant value to form a voltage ramp offset by the first voltage. A reference voltage may be compared to the voltage ramp during the second period of time. The output signal may be asserted at a time when the voltage ramp equals the reference voltage.

20 Claims, 10 Drawing Sheets

(58) Field of Classification Search
    CPC ..... H03L 7/197–199; H03L 7/16; H03L 7/18; H03L 7/1803; H03L 7/1806; H03B 5/24; H03B 5/04
    See application file for complete search history.

(56) References Cited

U.S. PATENT DOCUMENTS

| | | | |
|---|---|---|---|
| 6,353,649 B1 | 3/2002 | Bockleman et al. | |
| 6,720,959 B2 | 4/2004 | Haroun et al. | |
| 7,289,592 B2 | 10/2007 | Lee | |
| RE40,424 E | 7/2008 | Han et al. | |
| 7,417,510 B2* | 8/2008 | Huang | H03K 5/1565 327/117 |
| 7,463,710 B2 | 12/2008 | Walsh et al. | |
| 7,737,743 B1 | 6/2010 | Gao et al. | |
| 7,863,993 B1 | 1/2011 | Bohsali et al. | |
| 8,063,686 B1* | 11/2011 | Naviasky | H03K 5/135 327/236 |
| 8,299,827 B2 | 10/2012 | Subburaj et al. | |
| 8,483,856 B2 | 7/2013 | Hezar et al. | |
| 8,559,587 B1 | 10/2013 | Buell et al. | |
| 8,692,599 B2 | 4/2014 | Gong et al. | |
| 8,810,290 B1 | 8/2014 | Cloutier et al. | |
| 9,236,873 B1 | 1/2016 | Buell | |
| 9,257,991 B2 | 2/2016 | Pace | |
| 9,484,939 B2 | 11/2016 | Luo et al. | |
| 2002/0043993 A1* | 4/2002 | Tam | H03K 23/66 327/115 |
| 2003/0048863 A1 | 3/2003 | Saeki | |
| 2003/0184394 A1 | 10/2003 | Lin et al. | |
| 2004/0017233 A1 | 1/2004 | Wood | |
| 2005/0058236 A1 | 3/2005 | Ke | |
| 2005/0189972 A1 | 9/2005 | Foo et al. | |
| 2007/0146021 A1 | 6/2007 | Stikvoort et al. | |
| 2008/0042699 A1 | 2/2008 | Narathong et al. | |
| 2008/0043893 A1 | 2/2008 | Nagaraj et al. | |
| 2008/0079502 A1* | 4/2008 | Huang | H03L 7/1976 331/16 |
| 2008/0164917 A1* | 7/2008 | Floyd | H03L 7/1974 375/376 |
| 2008/0191750 A1 | 8/2008 | Wang | |
| 2008/0309420 A1 | 12/2008 | Fu et al. | |
| 2008/0315963 A1 | 12/2008 | Huang | |
| 2009/0045848 A1 | 2/2009 | Kiaei et al. | |
| 2009/0103675 A1 | 4/2009 | Yousefi Moghaddam et al. | |
| 2009/0108898 A1 | 4/2009 | Freyman et al. | |
| 2009/0128198 A1* | 5/2009 | Badets | H03K 5/135 327/107 |
| 2009/0140708 A1 | 6/2009 | Tateishi | |
| 2010/0046693 A1 | 2/2010 | Ellersick | |
| 2010/0102877 A1 | 4/2010 | Welland et al. | |
| 2011/0241746 A1 | 10/2011 | Fu | |
| 2011/0304374 A1 | 12/2011 | Krishnan | |
| 2012/0092051 A1 | 4/2012 | Erdogan | |
| 2012/0155573 A1* | 6/2012 | Pruvost | H04L 27/233 375/322 |
| 2013/0063196 A1* | 3/2013 | Nishiyama | H03K 5/13 327/237 |
| 2013/0207707 A1* | 8/2013 | Agrawal | H03K 5/135 327/237 |
| 2014/0037035 A1 | 2/2014 | Chung et al. | |
| 2014/0111257 A1 | 4/2014 | Ying et al. | |
| 2014/0247317 A1 | 9/2014 | Kawamura | |
| 2015/0207510 A1 | 7/2015 | Pace | |
| 2015/0214940 A1* | 7/2015 | Shibasaki | H03K 5/135 327/238 |
| 2015/0249454 A1* | 9/2015 | Giaconi | H04L 7/0332 375/376 |
| 2015/0349710 A1* | 12/2015 | Wang | H03K 3/30 331/143 |
| 2016/0187392 A1 | 6/2016 | Kumar | |
| 2016/0218899 A1 | 7/2016 | Hoshyar et al. | |
| 2017/0163271 A1 | 6/2017 | Wu | |

OTHER PUBLICATIONS

Meidong Lin et al., "Phase Interpolation Technique Based on High-Speed SERDES Chip CDR", 50th International Conference on Computer Sciences and Automation Engineering (ICCSAE 2015), Jan. 2016, pp. 160-165.
"Si5341/40 Rev D Data Sheet", Si5341/40 Rev D Data Sheet, Rev 1.0, Silicon Labs, Jul. 15, 2016, pp. 1-53.
George Souliotis et al, "Phase Interpolator with Improved Linearity", Circuits, Systems, and Signal Processing, Feb. 2016, vol. 35, Issue 2, first online May 29, 2015, pp. 367-383.
"Understanding Data Converters", Texas Instruments, Inc., Application Report, Mixed-Signal Products, SLAA013, 1995, pp. 1-22.
International Search Report for PCT Application No. PCT/US2017/060658 dated Mar. 6, 2018.
Extended European Search Report; PCT Application No. PCT/US2017060658; dated Nov. 20, 2019; 8 pages.
Korean Patent Application No. 10-2019-7012773 First Office Action with English Translation; dated Dec. 21, 2021; 18 pages.
China National Intellectual Property Administration, Office Action with Search Report, mailed Nov. 18, 2022, 11 pages.
Korean Intellectual Property Office, Notice of Preliminary Rejection, Dec. 14, 2022, 6 pages.

* cited by examiner

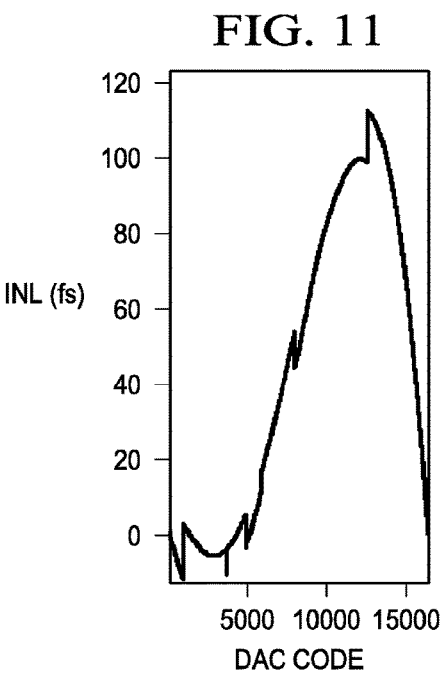

INL (fs)

DAC CODE

FIG. 12

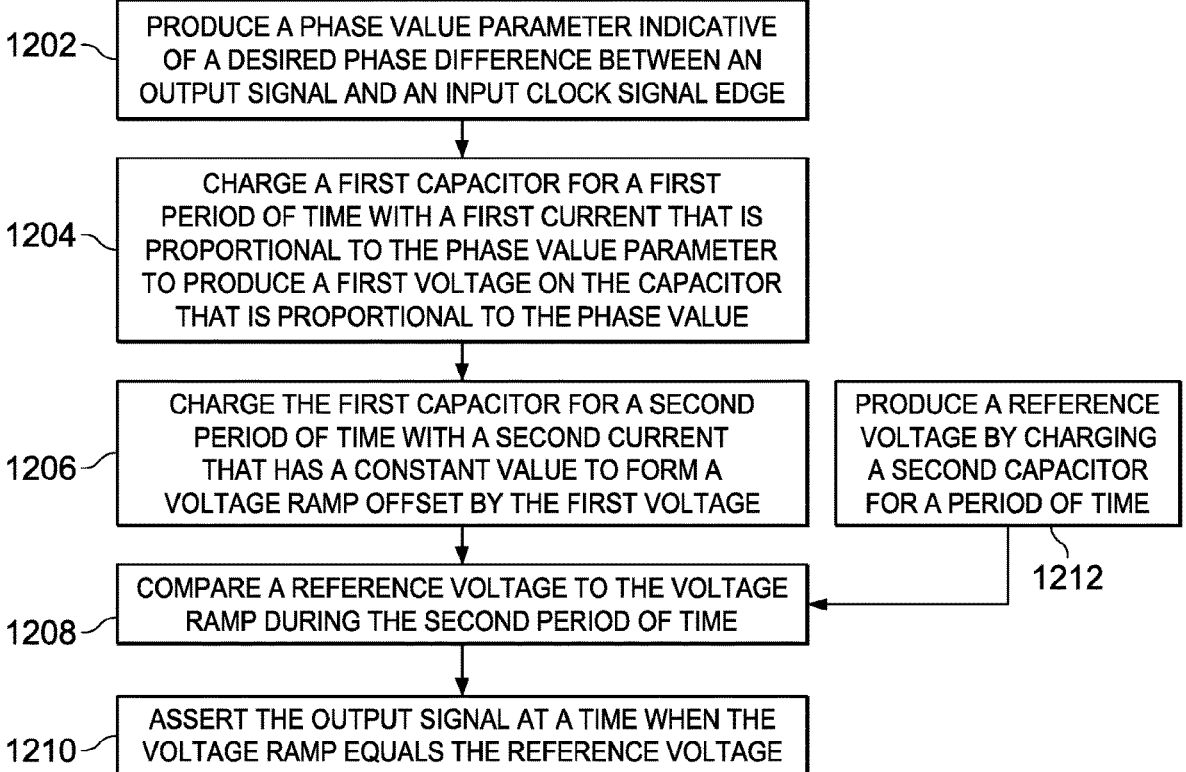

1202 — PRODUCE A PHASE VALUE PARAMETER INDICATIVE OF A DESIRED PHASE DIFFERENCE BETWEEN AN OUTPUT SIGNAL AND AN INPUT CLOCK SIGNAL EDGE

1204 — CHARGE A FIRST CAPACITOR FOR A FIRST PERIOD OF TIME WITH A FIRST CURRENT THAT IS PROPORTIONAL TO THE PHASE VALUE PARAMETER TO PRODUCE A FIRST VOLTAGE ON THE CAPACITOR THAT IS PROPORTIONAL TO THE PHASE VALUE

1206 — CHARGE THE FIRST CAPACITOR FOR A SECOND PERIOD OF TIME WITH A SECOND CURRENT THAT HAS A CONSTANT VALUE TO FORM A VOLTAGE RAMP OFFSET BY THE FIRST VOLTAGE

PRODUCE A REFERENCE VOLTAGE BY CHARGING A SECOND CAPACITOR FOR A PERIOD OF TIME

1212

1208 — COMPARE A REFERENCE VOLTAGE TO THE VOLTAGE RAMP DURING THE SECOND PERIOD OF TIME

1210 — ASSERT THE OUTPUT SIGNAL AT A TIME WHEN THE VOLTAGE RAMP EQUALS THE REFERENCE VOLTAGE

HIGH LINEARITY PHASE INTERPOLATOR

CROSS-REFERENCE TO RELATED APPLICATIONS

This application is a continuation of and claims priority to U.S. patent application Ser. No. 15/346,524, filed Nov. 8, 2016, which is incorporated herein by reference in its entirety.

FIELD OF THE INVENTION

This disclosure relates to phase interpolators, and in particular to phase interpolators that have a high linearity over a full range of operation.

BACKGROUND OF THE INVENTION

A phase interpolator (PI) may be used to generate a clock signal that is phase shifted from a reference clock signal by interpolating a specified amount of time from an edge of the reference clock signal.

A phase interpolator may be used in the clock and data recovery (CDR) loop of a serializer/deserializer (SerDes) communication interface, for example. The PI may be interposed between a phase locked loop (PLL) and the data samplers in order to shift a recovered clock phase to an appropriate position in the data sampling window. It may receive two clocks of the same frequency that are in-phase and quadrature phase (I-Q), respectively, and generate a clock output whose phase is the weighted summation of the two input phases. An ideal PI may be able to generate a number of equally spaced phase steps for a full cycle from 0 to 360 degrees.

Typically, SerDes applications do not require a highly linear PI in order to operate correctly.

BRIEF DESCRIPTION OF THE DRAWINGS

Particular embodiments in accordance with the invention will now be described, by way of example only, and with reference to the accompanying drawings:

FIG. 11 is a plot illustrating operation of the PI of FIG. 9; and

FIG. 12 is a flow chart illustrating operation of a high linearity phase interpolator.

Figures 1A, 1B:
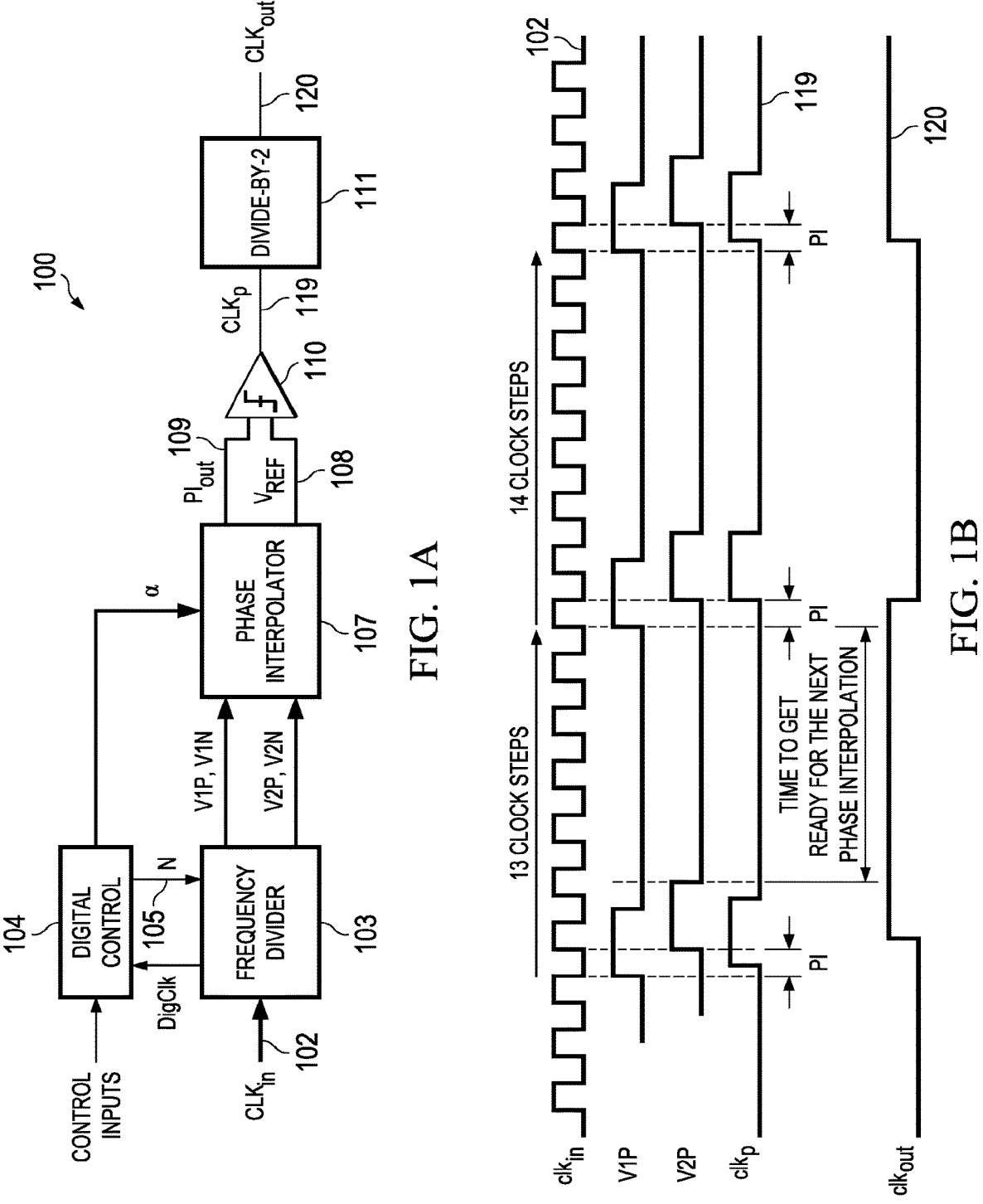
FIG. 1A is a block diagram and FIG. 1B is a timing diagram illustrating operation of an example fractional frequency divider.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Embodiments of the present invention may provide a high resolution, high linearity phase interpolator for applications that require better linearity than a typical SerDes application. Such application may include precision clock generators, for example.

Embodiments of an improved phase interpolator as disclosed herein eliminates the need for quadrature input signals and common-mode feedback. Required input and control signals may be easily generated by digital logic.

In one embodiment, a phase interpolator may be provided that has a resolution of 11 bits across a period of 200 ps (picosecond) to produce a time resolution of approximately 97.6 fs (femtosecond). Such resolution may be 40× better than the integer nonlinearity (INL) of conventional phase interpolators used in SerDes applications, for example.

FIG. 1A is a block diagram of an example fractional frequency divider (FFD) 100 that includes a high linearity phase interpolator 107. FFD 100 is operable to generate an output clock signal 120 that has a frequency equal to a specified fraction of an input clock signal 102. Input clock signal 102 may be selected to have a value that ranges between 10 MHz up to 10 GHz in this example embodiment. In other embodiments, a different range of input clock frequencies may be supported. Output clock signal 120 may be produced with a frequency that may be selected from a range of approximately 100 Hz to 1 GHz in this example.

Digital control circuitry 104 may be configured either in a hardwired manner or in a programmable manner to select a particular divider ratio between the output clock signal 120 and the input clock signal 102. Control circuitry 104 may include registers that are loaded by software or firmware that is executed on a processor that is coupled to FFD 100, for example.

FFD 100 operates by counting a specified number of clock periods of input clock 102 that is the desired approximate period of output clock signal 120, and then interpolating an amount of time between edges of clock signal 102 to produce the exact period length between edges of output clock signal 120. The operation of FFD 100 will be described briefly herein; a detailed description of the operation of an FFD such as FFD 100 is provided in U.S. patent application Ser. No. 15/281,617, "Fractional Frequency Clock Divider with Direct Division", Hoshyar et al, filed 2016 Sep. 30, which is incorporated by reference herein.

FIG. 1B is a timing diagram illustrating operation of FFD 100 for an example divide ratio of 13.75. Frequency divider 103 is configured to count a number N of edges of input clock signal 102 in response to a control parameter N 105 provided by digital control logic 104 and to produce "Nth clock" signals V1P, V2P. In this embodiment, frequency divider counts both the rising and falling edges of input clock signal 102. Phase interpolator 107 is configured to interpolate between two edges of input clock 102 as specified by phase parameter α. For example, if a divider ratio of 13.75 is specified, then control logic 104 may instruct counter 103 to count 13 edges (N=13) of input clock 102 and instruct PI 107 to then interpolate 0.75 (α=0.75) of a period of input clock 102 before asserting intermediate clock signal CLKp 119. On the next output period, control logic may then instruct counter 103 to count thirteen input periods and instruct PI 107 to then interpolate between half of a period of input clock 102. Intermediate clock signal 119 may then be divided by two in frequency by 111 to form output clock signal 120 with a 50% duty cycle and with a period of 13.75 periods of input clock 102. This process is then repeated for each period of output clock signal 120. Typically each period will require a different amount of phase interpolation because the fractional frequency ratio causes the edge relations between the output clock signal and the input clock signal to continually change.

In this example, parameter α is an 11-bit digital value (0-2047). In another example, α may have a higher or a lower resolution than 11-bits. Phase interpolator 107 generates a voltage PIout 109 that correlates to a requested phase shift amount indicated by parameter α. PIout 109 may be compared to a reference voltage Vref 108 by comparator 110. A transition on output clock signal 120 is produced by comparator 110 when PIout is equal to Vref, as will be described in more detail below.

Figure 2:
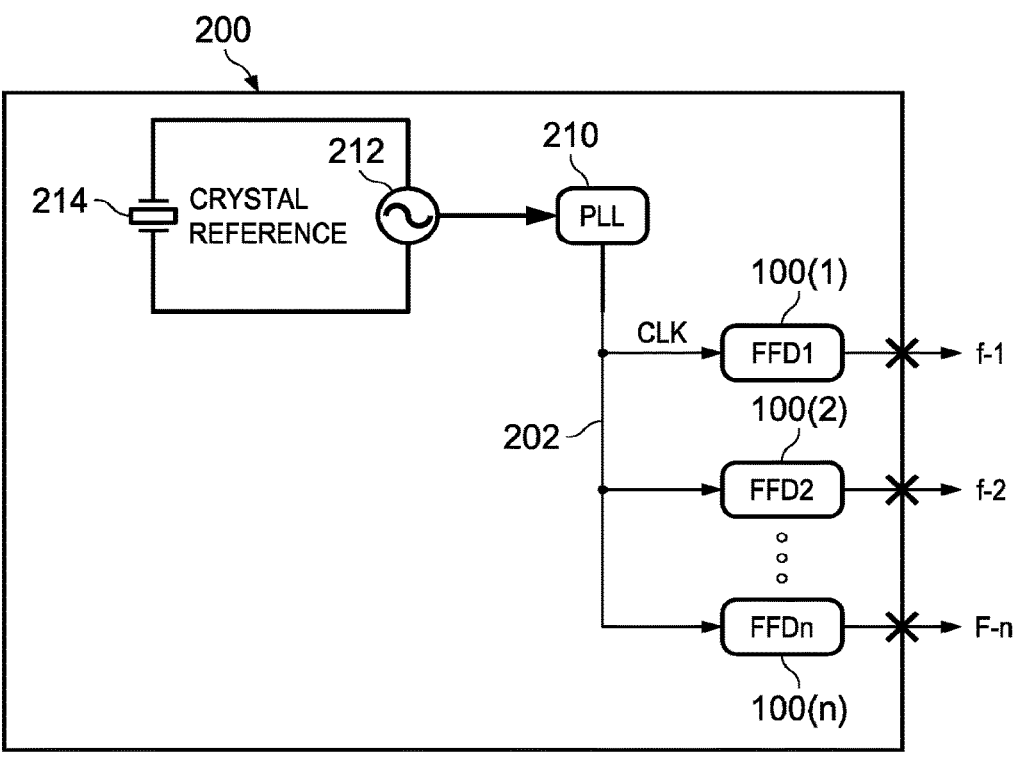
FIG. 2 is a block diagram of an example clock generator system that includes multiple fractional frequency dividers.

FIG. 2 is a block diagram of an example clock generator system 200 that includes one or more fractional frequency dividers 100(1)-100(n). System 200 may be fabricated on a single integrated circuit (IC) using known or later developed semiconductor processing techniques, for example. A phase locked loop (PLL) circuit 210 may be used to generate a fixed frequency reference clock signal 202 under control of crystal 214 controlled oscillator 212, for example. In some embodiments, crystal 214 may be located external to IC 200, for example. PLL circuits are well known and need not be described in detail herein. In another embodiment, other types of known or later developed clock generation circuits may be used, such as an oscillator with MEMs resonator, multivibrator, ring oscillator, delay line oscillator, etc. In another embodiment, reference clock 202 may be provided from an external source instead of from an on-chip source, for example.

In this manner, a single IC may provide multiple clock signals of different frequencies that are all synthesized from a single reference clock signal.

As will be described in more detail below, phase interpolator 107, referring back to FIG. 1, produces a phase shift in response to parameter a across a range of values in a highly linear manner. For purposes of this disclosure, "nonlinearity" may be described in a similar manner as commonly used for analog to digital convertors (ADC). To express the non-linearity of an ADC in a standard way, manufacturers typically draw a line through the ADC transfer function, called the best fit line. The maximum deviation from this line is called "integral nonlinearity (INL), which can be expressed in percentage of the full scale or in LSBs (Least Significant Bit). INL is measured from the center of each step to that point on the line, where the center of the step would be if the ADC was ideal. The term "differential" refers to the values an ADC takes between two consecutive levels. In response to a changing input signal, the ADC samples the signal and the output of the ADC is a stream of binary numbers. An ideal ADC will step up or down one Least Significant Bit (LSB), without skipping any level and without holding the same decimal number past two or three LSBs. Differential nonlinearity (DNL) is defined as the maximum deviation from one LSB between two consecutive levels, over the entire transfer function.

Figure 3:
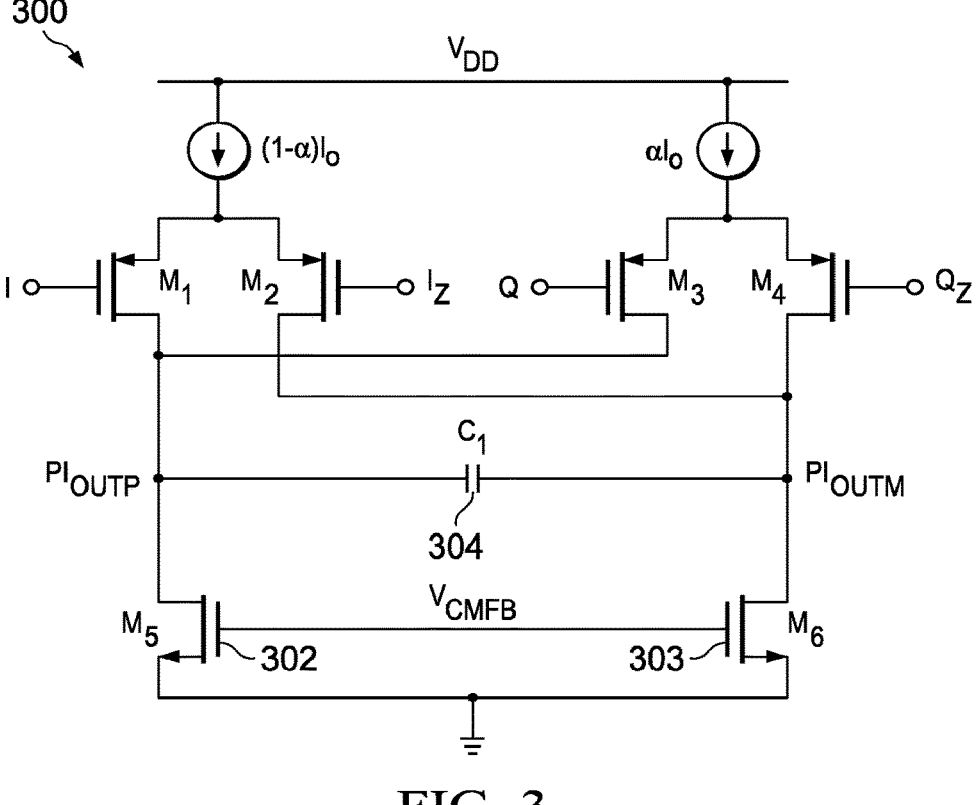
FIG. 3 is a schematic of a prior art phase interpolator.

FIG. 3 is a schematic of a prior art phase interpolator (PI) 300. The general operation of phase interpolators is well known; see e.g. "Phase Interpolator with Improved Linearity," Soulioutis et al, May 2015. Previous PIs typically require quadrature control signals I, Iz, Q, and Qz to control the operation of summing circuits that provide a charging current to capacitor 304. Some implementations such as this one also require common mode feedback (CMFB). However, a portion of the charging current may be lost to devices 302, 303 and thereby create nonlinearity. Simple PI circuits such as PI 300 may have an INL error of 60 LSB or more, which may be greater than 6000 fs when one LSB is 100 fs.

Figure 4:
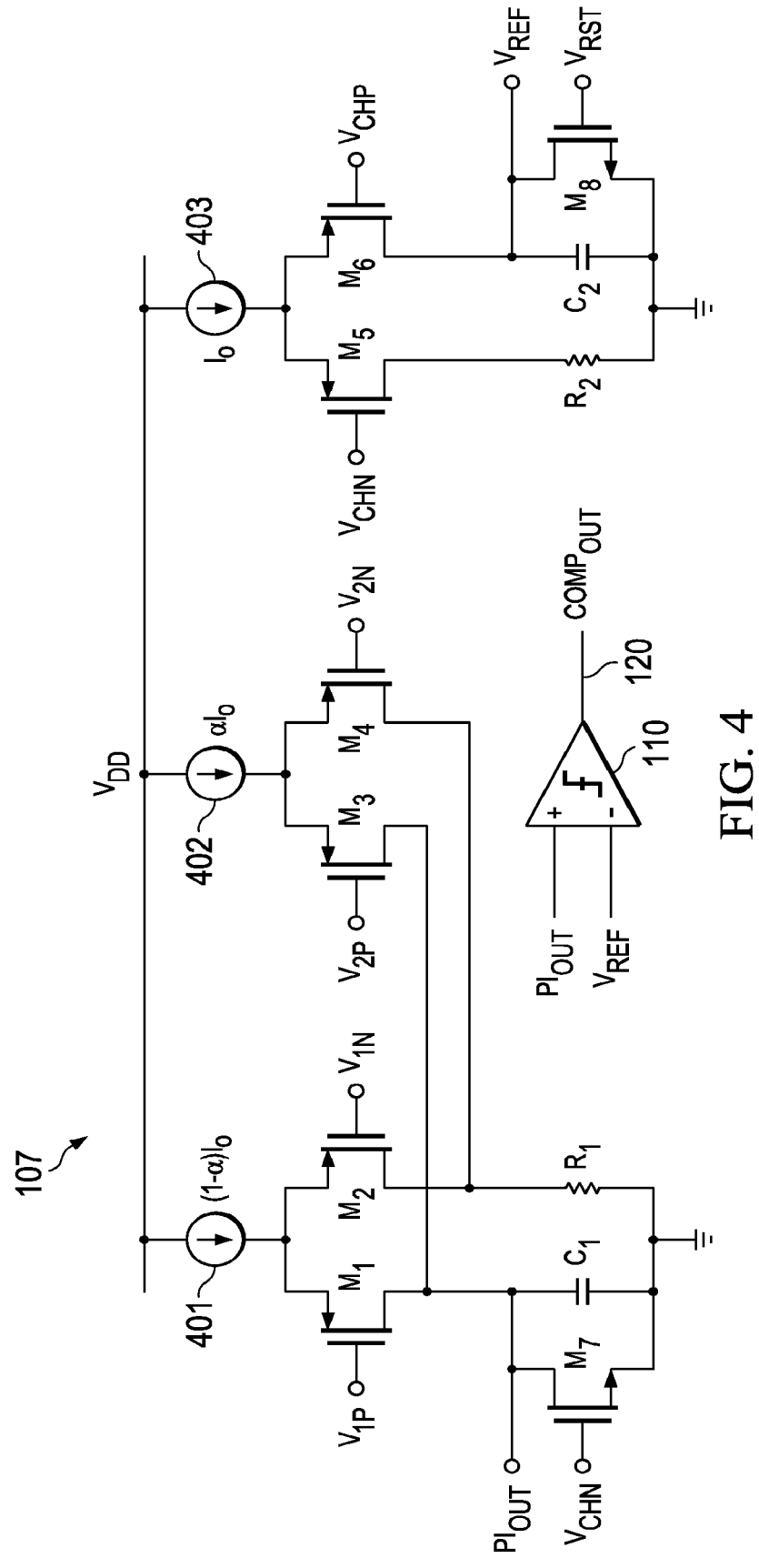
FIGS. 4-7 are schematics and timing diagrams that illustrate embodiments of improved phase interpolators.
Figure 5:
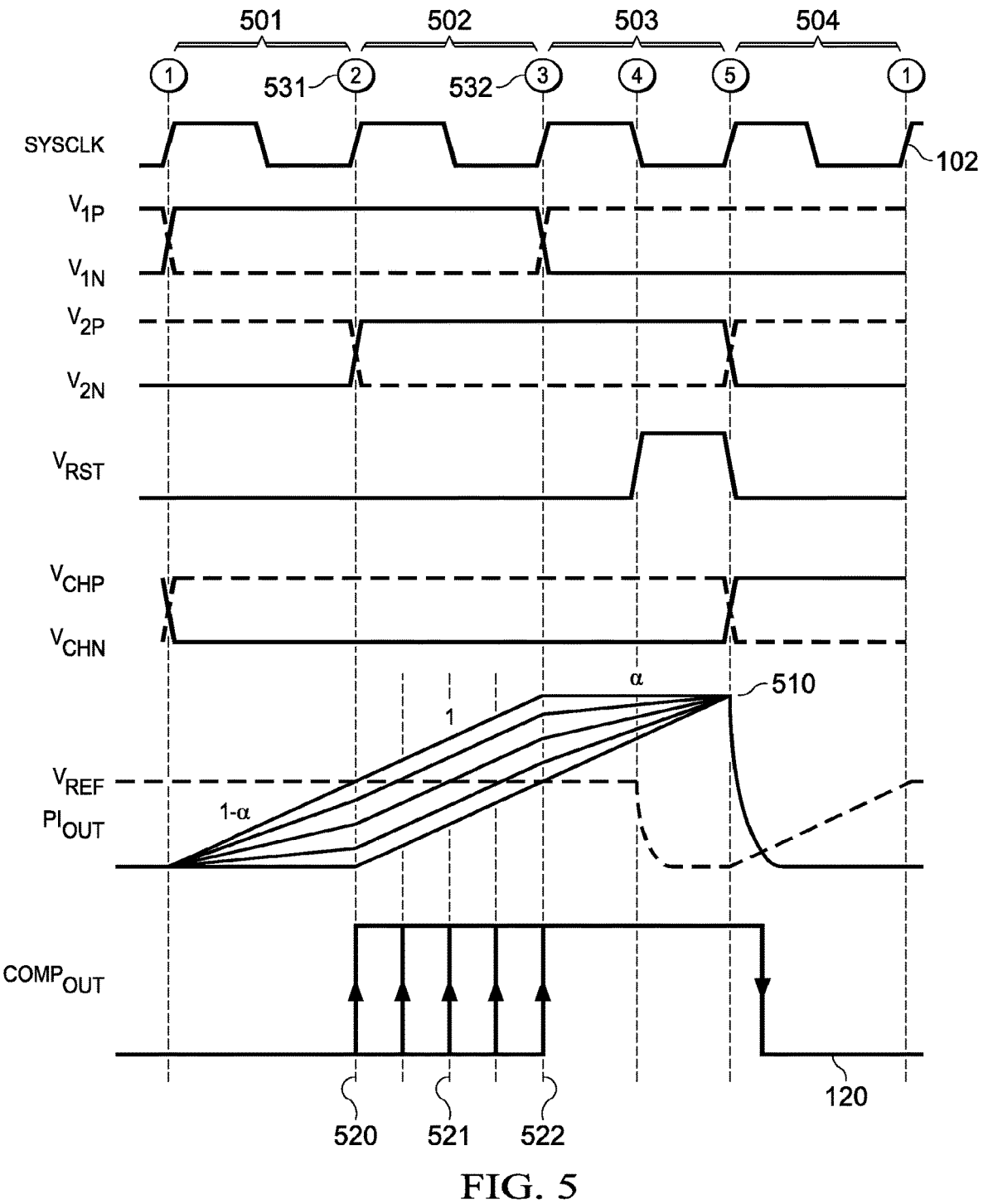

FIG. 4 is a schematic diagram that illustrates improved phase interpolator 400 that may be used for PI 107, referring back to FIG. 1, in more detail. FIG. 5 is a timing diagram that illustrates the operation of PI 400. As mentioned above, parameter α may be provided by control circuitry, such as control circuitry 104 in FIG. 1. Parameter α may be loaded into a register within or coupled to control logic 104, for example by execution of instructions, by other control logic, by initialization circuitry, by hardwired control logic, etc. In this example, parameter α is a fractional value having a value in a range of 0.0 to 1.0 that represents a percentage of a time period to shift the phase of output clock signal 120 with respect to input clock signal 102.

During each interpolation cycle, a first current source 401 is configured to produce a current proportional to (1−a) and a second current source 402 is configured to produce a current proportional to (α). Current sources 401, 402 may be implemented using digital to analog converters (DAC), for example. In this example, DACs with a resolution of twelve bits may be used; other embodiments may use DACs with a higher or a lower resolution, for example. The current sources may be controlled by control circuitry, such as control circuitry 104, referring again to FIG. 1.

During a first time period 501, the current from current source 401 is provided to ramp capacitor C1 via MOS device M1 while the current from current source 402 is dissipated by resistor R1 via MOS device M4. The current from current source 401 charges ramp capacitor C1 and produces a voltage PIout that ramps up with a slope that is proportional to (1−α) during first period of time 501 to produce a PIout voltage at time 531 that is proportional to the requested phase shift.

During a second period of time 502, the current proportional to (α) from current source 402 is also provided to ramp capacitor C1 via MOS device M3, such that the total current provided to capacitor C1 during period 502 is proportional to (α)+(1−α)=1. Thus, during period 502 a constant rate of charge is produced that is independent of parameter α. Thus, voltage PIout ramps up with a slope that is independent of parameter α during time period 502 and is offset by the PIout voltage at time 531. In this manner, a two step voltage ramp signal is produced in which the first step produces a voltage magnitude proportional to a requested phase shift at time 531 and in which the second step allows an output signal that has the requested phase shift to be produced based on the voltage magnitude at time 531.

During a third period of time 503, the current from current source 401 may be diverted to resistor R1 by MOS device M2 so that ramp capacitor C1 charges at a rate proportional to (α) during time period 503. In this manner, ramp capacitor C1 is charged to a same full charge voltage level as indicated at 510 during each repetition of the interpolation cycle, regardless of the value of parameter α.

A reference voltage Vref may be provided that has a value of ½ of full charge voltage 510, which corresponds to the maximum voltage seen at 531. By comparing PIout to Vref during the second period of time 502, a clock signal 120 may be generated that has a phase shift relative to input clock 102 that is extremely linear with respect to parameter α. For example, when α=0, clock signal 120 is asserted at time 520, which has a phase shift of 0 degrees relative to input clock signal 102. When α=0.5, clock signal 120 is asserted at time 521, which has a phase shift of 180 degrees relative to input clock signal 102. Similarly, when α=1.0, clock signal 120 is asserted at time 522, which has a phase shift of 360 degrees relative to input clock signal 102. Thus, any phase shift amount between 0-360 degrees may be produced by a corresponding selection of parameter α.

During time period 504, ramp capacitor C1 may be discharged by MOS device M7.

In this example, reference voltage Vref is produced by a third current source 403 that is configured to charge capacitor C2 during time period 504. Capacitor C2 may be reset during a second half of time period 503. In this manner, reference voltage Vref is produced under the same conditions as the rest of the PI circuit 400 so that mismatches caused by process variation are eliminated.

Figure 6:
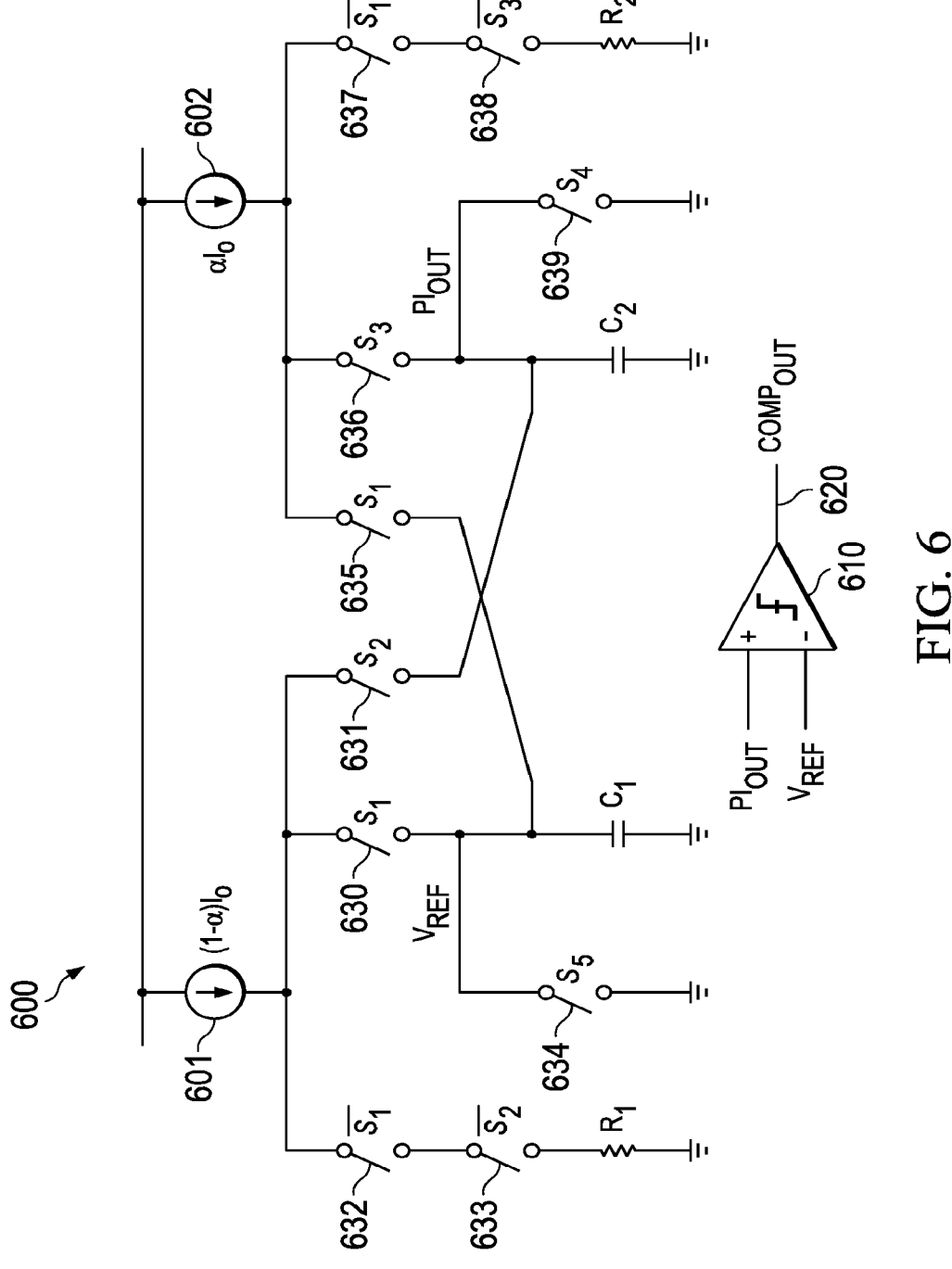
Figure 7:
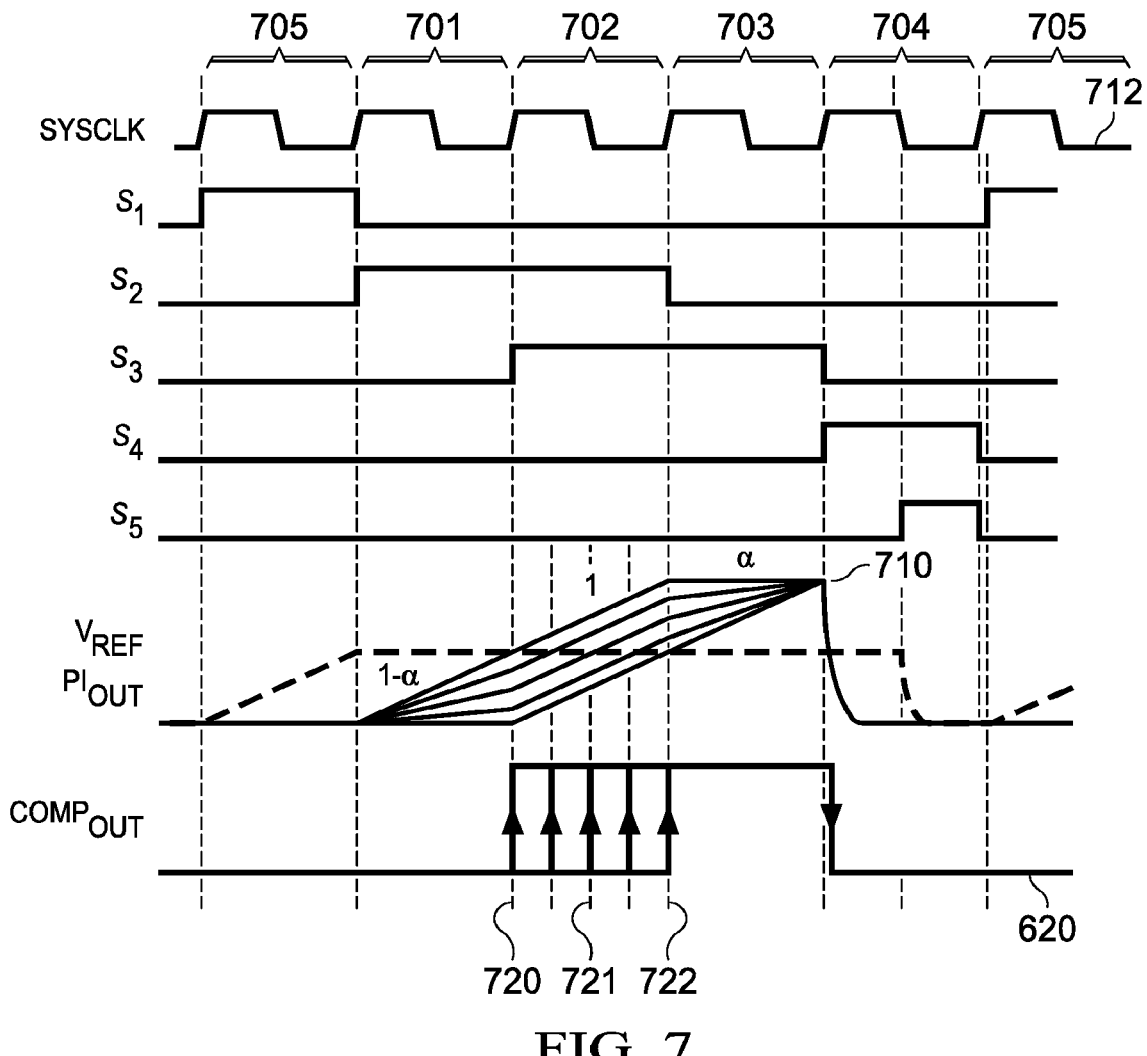

FIG. 6 is a schematic diagram that illustrates another implementation of an improved phase interpolator 600 that may be used as PI 107, referring back to FIG. 1. FIG. 7 is a timing diagram that illustrates the operation of PI 600. PI 600 may be implemented with a set of switch devices 630-639 that are controlled as indicated in FIG. 7 by timing signals S1-S5. The operation of PI 600 is similar to that of PI 400 as described with regard to FIGS. 4, 5. Switches 630-639 may be implemented using known or later developed devices, such as bipolar semiconductor devices, field effect devices, etc.

During each interpolation cycle, a first current source 601 is configured to produce a current proportional to (1−α) and a second current source 602 is configured to produce a current proportional to (α). During a first time period 701, the current from current source 601 is provided to ramp capacitor C2 via switch device 631 while the current from current source 602 is dissipated by resistor R2 via switch devices 637 and 638. The current from current source 601 charges ramp capacitor C2 and produces a voltage PIout that ramps up with a slope that is proportional to (1−α) during first period of time 701 to produce a PIout voltage at the end of period 701 that is proportional to the requested phase shift.

During a second period of time 702, the current proportional to (α) from current source 602 is also provided to ramp capacitor C2 via switch device 636, such that the total current provided to capacitor C2 during period 702 is proportional to (α)+(1−α)=1. Thus, during period 702 a constant rate of charge is produced that is independent of parameter α. Thus, voltage PIout ramps up with a slope that is independent of parameter α during time period 702.

During a third period of time 703, the current from current source 601 may be diverted to resistor R1 by switch devices 632 and 633 so that capacitor C2 charges at a rate proportional to (α) during time period 703. In this manner, ramp capacitor C2 is charged to a same full charge voltage level as indicated at 710 during each repetition of the interpolation cycle, regardless of the value of parameter α.

A reference voltage Vref may be provided that has a value of ½ of full charge voltage 710. By comparing PIout to Vref during the second period of time 702, a clock signal 620 may be generated that has a phase shift relative to input clock 712 that is extremely linear with respect to parameter α. For example, when α=0, clock signal 620 is asserted at time 720, which has a phase shift of 0 degrees relative to input clock signal 712. When α=0.5, clock signal 620 is asserted at time 721, which has a phase shift of 180 degrees relative to input clock signal 712. Similarly, when α=1.0, clock signal 620 is asserted at time 722, which has a phase shift of 360 degrees relative to input clock signal 712. Thus, any phase shift amount between 0-360 degrees may be produced by a corresponding selection of parameter α.

During time period 704, capacitor C2 is discharged by switch device 639.

In this example, reference voltage Vref is produced by current from both current sources 601 and 602 that is configured to charge capacitor C1 during time period 705 via switches 630 and 635. Capacitor C1 is reset during a second half of time period 704 by switch 634 in this example. In another embodiment, capacitor C1 may be reset during the second half of time period 703 and charged during time period 704, for example. In this manner, reference voltage Vref is produced under the same conditions as the rest of the PI circuit 600 so that mismatches caused by process variation are eliminated.

Figure 8:
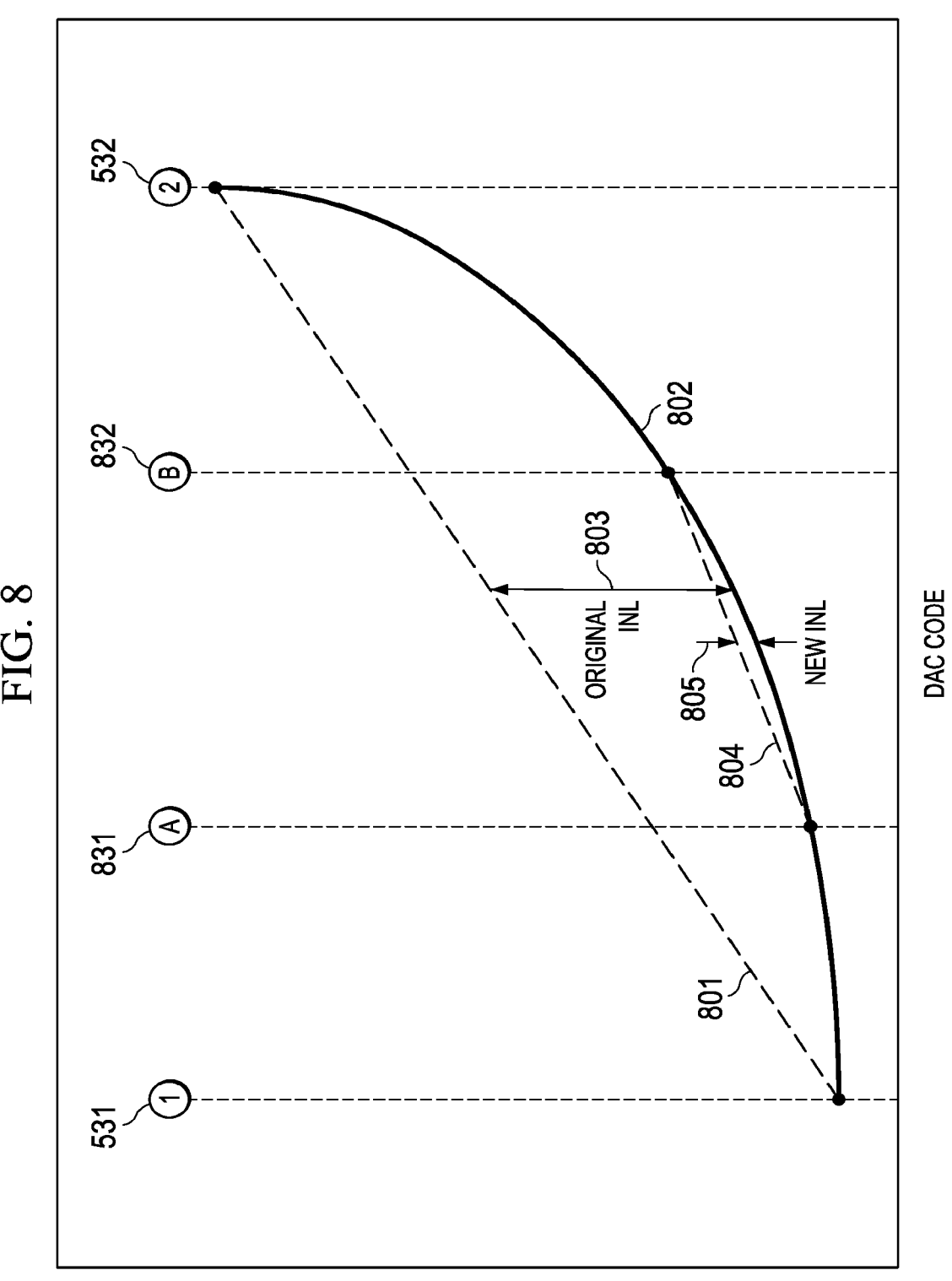
FIG. 8 is a plot illustrating a further improvement in nonlinearity.

FIG. 8 is a plot illustrating nonlinearity that may occur in PI circuit 107 of FIG. 4 and PI circuit 600 FIG. 6. Referring back to the timing diagram FIG. 5, glitch interference caused by signal switching at timing points 531 and 532 may cause nonlinear errors when parameter α has a value that is near its min or max, respectively. Plot line 801 represents an ideal linear response curve between timing points 531 and 532. Plot line 802 represents a possible response curve due to signal glitches around timing points 531 and 532. An INL magnitude indicated at 803 may result. A scheme will now be disclosed that allows a phase interpolator to be operated in a more linear region, such as the region between timing points 831 and 832. In this case, an ideal linear response 804 in this region will result in a much lower INL magnitude, as indicated at 805.

Figure 9:
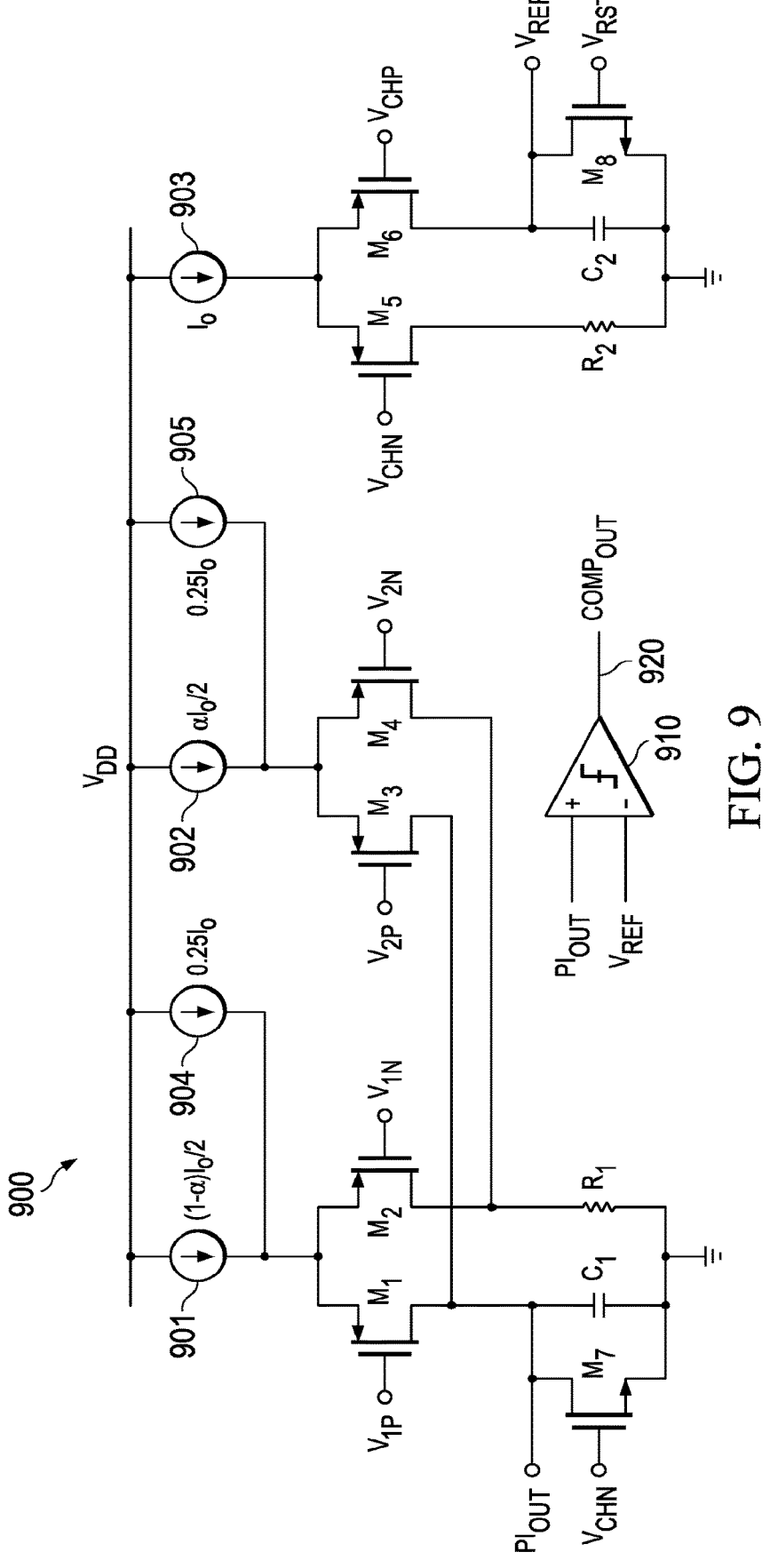
FIG. 9 is a schematic diagram illustrating another embodiment of a phase interpolator.
Figure 10:
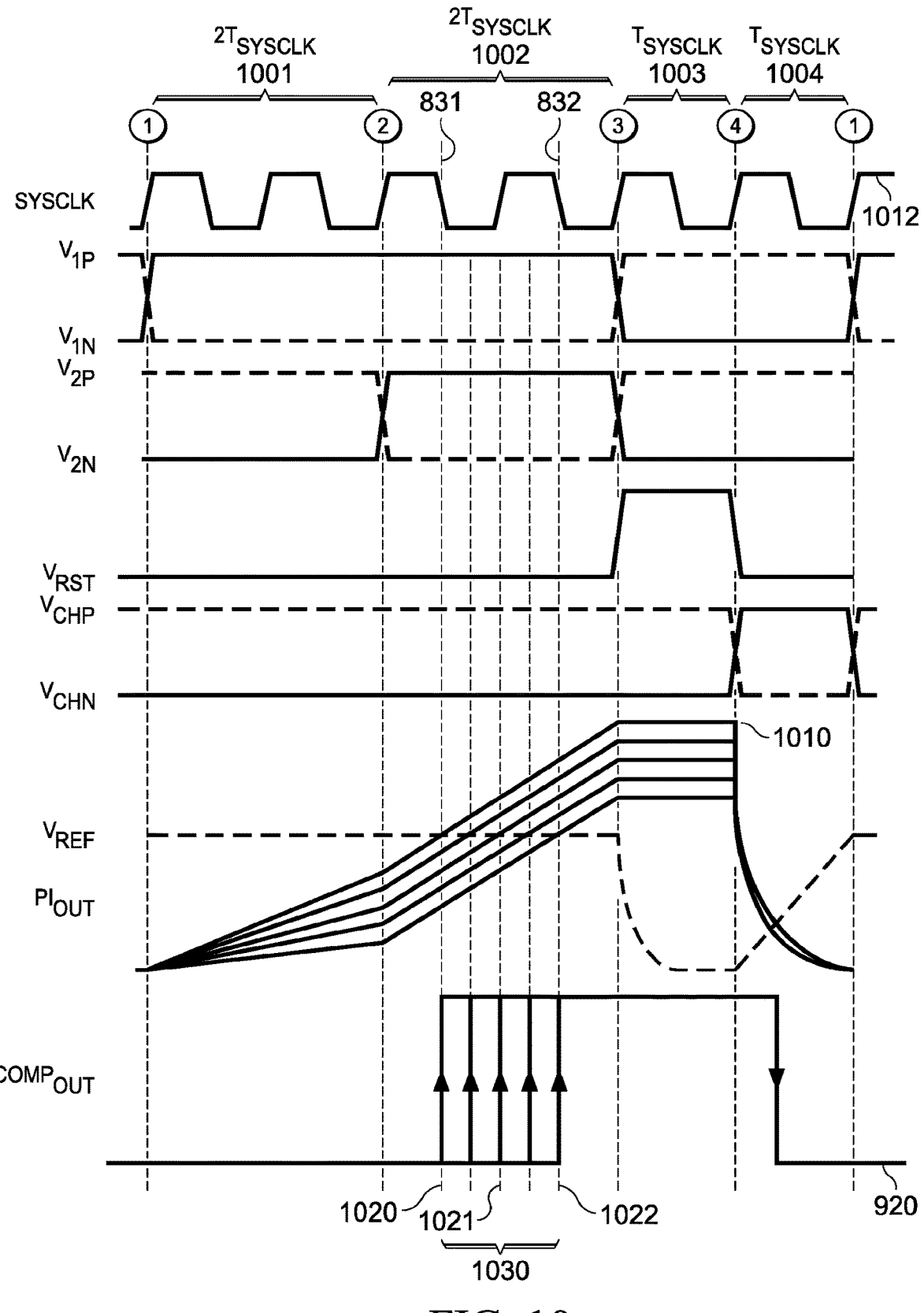
FIG. 10 is a timing diagram illustrating operation of the PI of FIG. 9.

FIG. 9 is a schematic diagram illustrating another embodiment of a phase interpolator 900 that may be used as PI 107, referring back to FIG. 1. FIG. 10 is a timing diagram illustrating operation of the PI 900. PI 900 is similar to PI 400, referring back to FIG. 4, in that it has a first current source 901 configured to produce a current proportional to (1−α) and a second current source 902 is configured to produce a current proportional to (α). However, current source 901 and 902 each use a reference current that has a value of 0.5 I(0). In order to compensate for the lower current value, the first time period 1001 and the second time period 1002 span two periods of input clock 1012.

A second set of current sources 904, 905 are included to provide a "pedestal current" that shifts the voltage ramp of PIout produced by charging capacitor C1 by an additional constant amount. In this embodiment, current sources 904, 905 provide a constant current of 0.25 I(0).

During first time period 1001, the current from current source 901 and 904 is provided to ramp capacitor C1 via MOS device M1 while the current from current source 902 and 905 is dissipated by resistor R1 via MOS device M4. The current from current sources 901, 904 charge ramp capacitor C1 and produce a voltage PIout that ramps up with a slope that is proportional to (1−α) during first period of time 1001, which is two periods of input clock 1012, to produce a PIout voltage at time 1031 that is proportional to the requested phase shift.

During a second period of time 1002, the current proportional to (α) from current source 902 and the fixed current from current source 905 are also provided to ramp capacitor C1 via MOS device M3, such that the total current provided to ramp capacitor C1 during period 1002 is proportional to (α)+(1−α)=1. Thus, during period 1002 a constant rate of charge is produced that is independent of parameter α. Thus, voltage PIout ramps up with a slope that is independent of parameter α during time period 1002.

A reference voltage Vref may be provided that has a value of approximately 0.5 of full charge voltage 1010. By comparing PIout to Vref during only sampling period 1030 that is only a central portion of the second period of time 1002, a clock signal 920 may be generated that has a phase shift relative to a falling edge of input clock 1012 that is extremely linear with respect to parameter α. For example, when α=0, clock signal 920 is asserted at time 1020, which has a phase shift of 0 degrees relative to the falling edge of input clock signal 1012. When α=0.5, clock signal 1020 is asserted at time 1021, which has a phase shift of 180 degrees relative to the falling edge of input clock signal 1012. Similarly, when α=1.0, clock signal 920 is asserted at time 1022, which has a phase shift of 360 degrees relative to the falling edge of input clock signal 102. Thus, any phase shift amount between 0-360 degrees may be produced by a corresponding selection of parameter α. Furthermore, reduced sampling period 1030 avoids glitching that may be caused by switching of the control signals.

During time period 1003, capacitor C1 may be discharged by MOS device M7.

In this example, reference voltage Vref is produced by a third current source 903 that is configured to charge capacitor C2 during time period 1004. Capacitor C2 may be reset during time period 1003 by MOS device M8. In this manner, reference voltage Vref is produced under the same conditions as the rest of the PI circuit 900 so that mismatches caused by process variation are eliminated.

FIG. 11 is a plot illustrating simulated operation of PI 900 in which one LSB corresponds to 100 fs. In this example, PI 900 exhibits a maximum INL of only 120 fs, which corresponds to 1.2 LSB, as illustrated in FIG. 11. This compares to a max INL error of over 6000 fs in the prior art device illustrated in FIG. 3.

FIG. 12 is a flow chart illustrating operation of a high linearity phase interpolator, such as described above with regards to FIGS. 3-10. As described with regard to FIGS. 1-2, a high linearity phase interpolator may be used to generate accurate fractional frequency clock signals from a fixed reference frequency, for example.

A phase value parameter indicative of a desired phase difference between an output signal and an input clock signal edge may be produced 1202 by control logic coupled to the phase interpolator.

A first capacitor may be charged 1204 for a first period of time with a first current that is proportional to the phase value parameter to produce a first voltage on the capacitor that is proportional to the phase value parameter. As described in more detail above, a current source controlled by a DAC may be used to produce the first current. The phase value parameter may be used to control the DAC. For example, the phase value may be a 12-bit digital value that is provided to a 12-bit DAC.

The first capacitor may be further charged 1206 for a second period of time with a second current that has a constant value to form a voltage ramp offset by the first voltage. As disclosed above, the second current source may also be implemented using a DAC for control.

A reference voltage may be compared 1208 to the voltage ramp during the second period of time. As disclosed above, a comparator such as comparator 110 in FIG. 4 may be used for this comparison.

The output signal may then be asserted 1210 at a time when the voltage ramp equals the reference voltage to produce an output signal that is offset from the input clock by a phase amount specified by the phase value parameter.

As disclosed above in more detail, a reference voltage may be produced 1212 by a current source that is configured to charge a second capacitor during another time period. The second capacitor may be reset at the end of each interpolation cycle. In this manner, a reference voltage may be produced under the same conditions as the rest of the PI circuit so that mismatches caused by process variation are eliminated.

Other Embodiments

While the invention has been described with reference to illustrative embodiments, this description is not intended to be construed in a limiting sense. Various other embodiments of the invention will be apparent to persons skilled in the art upon reference to this description. For example, referring back to FIG. 4, in another embodiment current source 401 may have a value of $(\alpha)I_0$ and current source 402 may have a value of $(1-\alpha)I_0$, for example.

In another embodiment, current source 401 may have a current value that is proportional to parameter α and current source 402 may have a constant current value of $I_1$. In this case, current from current source 401 may be directed to resistor R1 during time period 502 so that a ramp voltage with a fixed slope is produced by current source 402 alone during sample period 502.

In another embodiment, various combinations of current sources may be configured to produce a voltage slope proportional to requested phase shift amount during a first period of time and to produce an additional voltage slope having a fixed slope during a sampling period of time.

In various embodiments, the ramp capacitor may be implemented as a discrete capacitor, a MOS device, multiple devices, etc.

In another embodiment, a two step ramp signal for determining a phase shift may be produced using another type of device characteristic, such as producing a current that has a two step ramp using an inductive device, for example.

While a fractional frequency clock generator system was disclosed herein, other systems may embody the high linearity phase interpolator disclosed herein for functions such as clock recovery for SerDes interfaces, frequency control of PLLs, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An apparatus comprising:
a first current source having a first current output;
a second current source having a second current output;
a third current source having a third current output;
a first capacitor having a first capacitor terminal;
a second capacitor having a second capacitor terminal;
a first switch having a first switch control input, and the first switch coupled between the first current output and the first capacitor terminal;
a second switch having a second switch control input, and the second switch coupled between the second current output and the first capacitor terminal;
a third switch having a third switch control input, and the third switch coupled between the third current output and the second capacitor terminal;
a control circuit having a clock input, first, second, and third switch control outputs, the first switch control output coupled to the first switch control input, the second switch control output coupled to the second switch control input, and the third switch control output coupled to the third switch control input, in which the third switch control output has a different duty cycle from at least one of the first or second switch control outputs; and
a comparator having a first input, a second input, and a comparator output, the first input coupled to the first capacitor terminal, the second input coupled to the second capacitor terminal, and the comparator output coupled to a clock output, the comparator configured to set a state of the clock output responsive to a comparison between a first voltage at the first capacitor terminal and a second voltage at the second capacitor terminal.

2. The apparatus of claim 1, wherein:
the control circuit is part of a clock divider circuit, and the clock divider circuit configured to:
receive an input clock signal at the clock input;
generate a first control signal and a second control signal by dividing down the input clock signal, in which each of the first and second control signals has a respective cycle period that spans multiple cycle periods of the input clock signal;
provide the first and second control signals at, respectively, the first and second switch control outputs to:
in a first period, enable the first switch, and disable the second switch;
in a second period, enable the first and second switches; and
in a third period, disable the first switch;
the comparator is part of a clock generation circuit configured to provide an output clock signal at the clock output having a phase shift from the input clock signal;
the amount of the phase shift, the first current, and the second current are adjustable; and
a range of the amount of the phase shift is within a cycle period of the input clock signal.

3. The apparatus of claim 2, wherein the clock divider circuit is configured to enable the second switch in the third period.

4. The apparatus of claim 2, wherein:
the first period is a first cycle period of the input clock signal;
the second period is a second cycle period of the input clock signal; and
the third period is a third cycle period of the input clock signal.

5. The apparatus of claim 4, wherein the control circuit is configured to enable the third switch in the first and second periods and disable the third switch after the second period;
wherein the third switch and the second capacitor is part of a reference generator, and the reference generator is configured to:
in the first and second periods, provide a first reference voltage as the second voltage at the second capacitor terminal; and
after the second period, provide a second reference voltage as the second voltage at the second capacitor terminal; and
wherein the clock generation circuit is configured to:
generate a first edge of the output clock signal responsive to the first voltage at the first capacitor terminal and the first reference voltage; and
generate a second edge of the output clock signal responsive to the first voltage and the second reference voltage.

6. The apparatus of claim 5,
wherein the control circuit is configured to disable the third switch in the first, second, and third periods, and enable the third switch after the third period.

7. The apparatus of claim 2, wherein:
the first current source has a first current control input, and the first current source is configured to provide a first current at the first current output responsive to a first current control signal at the first current control input;
the second current source has a second current control input, and the second current source is configured to provide a second current at the second current output responsive to a second current control signal at the second current control input;
the apparatus further comprises a digital control circuit having a first current control output and a second current control output, the first current control output coupled to the first current control input, the second current control output coupled to the second current control input, and the digital control circuit is configured to provide the first and second current control signals at the respective first and second current control outputs.

8. The apparatus of claim 7, wherein:
the second current control signal represents a first ratio between the amount of the phase shift and a cycle period of the input clock signal; and
the first current control signal represents a second ratio, and a sum of the first and second ratios equals one.

9. The apparatus of claim 7, wherein:
the second current control signal represents a first ratio between the amount of the phase shift and a cycle period of the input clock signal; and
the first current control signal represents a second ratio, and a sum of the first and second ratios equals one half.

10. The apparatus of claim 9, further comprising:

a fourth current source having a fourth current output, in which the first switch is coupled between the fourth current output and the first capacitor terminal; and a fifth current source having a fifth current output, in which the second switch is coupled between the fifth current output and the first capacitor terminal, wherein the fourth and fifth current sources are configured to provide a same current.

11. The apparatus of claim 10, wherein the control circuit is configured to disable the second switch in the third period.

12. The apparatus of claim 2, further comprising:

a fourth switch coupled between the first current output and a reference terminal; and a fifth switch coupled between the second current output and the reference terminal.

13. The apparatus of claim 12, further comprising:

a sixth switch coupled between the third current output and the reference terminal;

a seventh switch coupled between the second capacitor terminal and the reference terminal.

14. The apparatus of claim 13, wherein:

the fourth, fifth, sixth, and seventh switches have respective fourth, fifth, sixth, and seventh switch control inputs;

the clock divider circuit has fourth, fifth, sixth, and seventh switch control outputs coupled to the respective fourth, fifth, sixth, and seventh switch control inputs, and the clock divider circuit is configured to:

generate fourth, fifth, sixth, and seventh control signals by dividing down the input clock signal, in which each of the fourth, fifth, sixth, and seventh control signals has a respective cycle period that spans multiple cycle periods of the input clock signal; and provide the fourth, fifth, sixth, and seventh control signals at, respectively, the fourth, fifth, sixth, and seventh switch control outputs to:

in the first period: disable the fourth switch, enable the fifth switch, enable the sixth switch, and disable the seventh switch;

in the second period: disable the fourth and fifth switch, enable the sixth switch, and disable the seventh switch;

in the third period: enable the fourth switch, enable the sixth switch, and enable the seventh switch; and after the third period: enable the fourth switch, disable the sixth switch, and disable the seventh switch.

15. An apparatus comprising:

a first current source having a first current output;

a second current source having a second current output;

a first capacitor having a first capacitor terminal;

a second capacitor having a second capacitor terminal;

a first switch coupled between the first current output and the first capacitor terminal, the first switch having a first switch control input;

a second switch coupled between the second current output and the first capacitor terminal, the second switch having a second switch control input;

a third switch coupled between the first current output and the second capacitor terminal, the third switch having a third switch control input;

a fourth switch coupled between the second current output and the second capacitor terminal, the fourth switch having a fourth switch control input;

a control circuit having a clock input, first, second, third, and fourth switch control outputs, the first switch control output coupled to the first switch control input, the second switch control output coupled to the second switch control input, the third switch control output coupled to the third switch control input, and the fourth switch control output coupled to the fourth switch control input; and a comparator having a first input, a second input, and a comparator output, the first input coupled to the first capacitor terminal, the second input coupled to the second capacitor terminal, and the comparator output coupled to a clock output, the comparator configured to set a state of the clock output responsive to a comparison between a first voltage at the first capacitor terminal and a second voltage at the second capacitor terminal.

16. The apparatus of claim 15, further comprising:

a fifth switch coupled between the first current output and a reference terminal, the fifth switch having a fifth switch control input; and a sixth switch coupled between the second current output and the reference terminal, the sixth switch having a sixth switch control input.

17. The apparatus of claim 16, wherein:

the control circuit has third, fourth, fifth, and sixth switch control outputs coupled to the respective third, fourth, fifth, and sixth switch control inputs, and the control circuit is configured to:

in a first period: enable the first and second switches and disable the third, fourth, fifth, and sixth switches;

in a second period: disable the first and second switches, enable the third switch, disable the fourth switch and the fifth switch, and enable the sixth switch;

in a third period: disable the first and second switches, enable the third and fourth switches, and disable the fifth and sixth switches; and in a fourth period: disable the first, second, third, and fourth switches, and enable the fifth and sixth switches.

18. The apparatus of claim 17, wherein the control circuit is part of a clock divider circuit, and the clock divider circuit configured to:

receive an input clock signal at the clock input;

generate first, second, third, fourth, fifth, and sixth control signals by dividing down the input clock signal, in which each of the first and second control signals has a respective cycle period that spans multiple cycle periods of the input clock signal; and provide the first, second, third, fourth, fifth, and sixth control signals at, respectively, the first, second, third, fourth, fifth, and sixth switch control outputs.

19. The apparatus of claim 18, wherein:

the first current source has a first current control input, and the first current source is configured to provide a first current at the first current output responsive to a first current control signal at the first current control input;

the second current source has a second current control input, and the second current source is configured to provide a second current at the second current output responsive to a second current control signal at the second current control input;

the apparatus further comprises a digital control circuit having a first current control output and a second current control output, the first current control output coupled to the first current control input, the second current control output coupled to the second current control input, and the digital control circuit is config-
ured to provide the first and second current control
signals at the respective first and second current control
outputs.

20. The apparatus of claim 19, wherein:

the second current control signal represents a first ratio
between the amount of the phase shift and a cycle
period of the input clock signal; and the first current control signal represents a second ratio,
and a sum of the first and second ratios equals one.

14

\* \* \* \* \*